US008542547B2

(12) United States Patent
Kajigaya

(10) Patent No.: US 8,542,547 B2
(45) Date of Patent: Sep. 24, 2013

(54) SEMICONDUCTOR DEVICE AND DATA PROCESSING SYSTEM

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 250 days.

(21) Appl. No.: 13/067,552

(22) Filed: Jun. 8, 2011

(65) Prior Publication Data

US 2011/0304382 A1  Dec. 15, 2011

(30) Foreign Application Priority Data

Jun. 9, 2010  (JP) .................................. 2010-132483

(51) Int. Cl.
*G11C 7/00* (2006.01)

(52) U.S. Cl.
USPC ......................................... 365/205; 365/203

(58) Field of Classification Search
USPC ................................................ 365/203, 205
See application file for complete search history.

(56) References Cited

U.S. PATENT DOCUMENTS

| 5,426,603 A | 6/1995 | Nakamura et al. |
| 2005/0105373 A1 * | 5/2005 | Takase et al. .................. 365/232 |
| 2012/0250442 A1 * | 10/2012 | Roy et al. ...................... 365/203 |

FOREIGN PATENT DOCUMENTS

| JP | 5-101643(A) | 4/1993 |
| JP | 6-223570(A) | 8/1994 |

* cited by examiner

*Primary Examiner* — Hoai V Ho
(74) *Attorney, Agent, or Firm* — McGinn IP Law Group, PLLC

(57) ABSTRACT

A semiconductor device comprises a first sense amplifier, first to third transmission lines, and first to third switches. The first and second transmission lines are connected to the first sense amplifier. The first and third switches control connections of the first to third transmission lines, and the second switch controls a connection between a fixed potential and third transmission line. When the second transmission line is not accessed, the first and third switches are brought into a non-conductive state and the second switch is brought into a conductive state, and the fixed potential is supplied to the third transmission line, thereby suppressing influence of the coupling noise between the transmission lines.

23 Claims, 16 Drawing Sheets

SEMICONDUCTOR DEVICE AND DATA PROCESSING SYSTEM

BACKGROUND OF THE INVENTION

1. Field of the Invention

The present invention relates to a semiconductor device provided with a memory cell array of an open bit line structure or a single-ended structure, and particularly relates to a semiconductor device comprising a configuration in which a plurality of sense amplifiers are arranged at an end of the memory cell array in a zigzag alignment.

2. Description of Related Art

In recent years, an increase in capacity and miniaturization of manufacturing scale have been achieved in a semiconductor device such as DRAM. Therefore, capacitances of bit lines arranged in the memory cell array increase, and thereby measures against an increase in charge/discharge current of the bit lines and a reduction in sensing margin of sense amplifiers are required. Regarding configurations and connection relations of the memory cell array and the sense amplifier, various techniques have been conventionally disclosed (For example, refer to Patent References 1 and 2). The Patent Reference 1 discloses a technique for controlling the connection relation between sense amplifies arranged in the zigzag alignment and bit line pairs divided at an approximate center position in a memory cell array of a folded bit line structure. This technique enables to improve sensing margin and sensing speed of the bit lines through which data is read, and thereby the charge/discharge current of the bit lines in an amplification operation can be reduced by 25 percent. Further, the Patent Reference 2 discloses that when two memory cell arrays of the open bit line structure are selected at the same time, the charge/discharge current can be reduced by 25 percent in an amplification operation of the sense amplifiers by dividing the bit lines of one of the two memory cell arrays at an approximate center position thereof.

[Patent Reference 1] Japanese Patent Application Laid-open No. 5-101643

[Patent Reference 2] Japanese Patent Application Laid-open No. 6-223570 (U.S. Pat. No. 5,426,603)

When the manufacturing scale is miniaturized, pitch of the bit lines arranged in the memory cell array becomes small, and space restriction of circuit arrangement requires the zigzag alignment of the sense amplifiers at both ends of the bit lines. However, since the sense amplifiers in the Patent Reference 2 are not arranged in the zigzag alignment, it is difficult to deal with the miniaturization of manufacturing scale. Therefore, a case of applying a technique obtained by combining the technique of the Patent Reference 2 with the technique of the Patent Reference 1 will be considered. FIG. 16 shows a configuration of a memory cell array in this case. In FIG. 16, a plurality of bit lines BL are alternately connected to sense amplifiers SAe and SAo arranged in the zigzag alignment, and are divided into bit lines BLLe, BLLLo on the left and bit lines BLRe, BLRo on the right by switches Se and So placed at an approximate center position. For example, when an arbitrary word line WLLi of a left area is selected, the switches Se are turned off and the switches So are turned on, so that the bit lines BLRe on the right that are not accessed (non-selected side is represented by dashed lines in FIG. 16) are disconnected from the bit lines BLLe on the left. Here, high-level data is read out to one of two bit lines BLRo adjacent to each disconnected bit line BLRe while low-level data is read out to the other thereof, and a situation is assumed in which the low-level data is written into the bit lines BLRo by inverting the high-level data that has been transmitted to the bit lines BLRo after the amplification operation of the sense amplifiers SAe and Sao. At this point, with the miniaturization of manufacturing scale, a capacitance Cbb between adjacent bit lines BLRe and BLRo becomes large. Thus, the disconnected bit lines BLRe on the right are changed to a negative voltage by coupling noise, and there arises a problem that electric charge leaks from memory cells MC being connected to the bit lines BLRe and storing the high-level data. Therefore, even when the configuration of FIG. 16 is employed, it is difficult to achieve effects of an improvement of the operating margin of the semiconductor device and a reduction in consumption current.

SUMMARY

One of aspects of the invention is a semiconductor device comprising: a first sense amplifier; a first transmission line connected to the first sense amplifier; a second transmission line electrically connected to the first sense amplifier via the first transmission line; a first switch controlling a connection between the first and second transmission lines; and a second switch controlling a connection between a predetermined fixed potential and the second transmission line, wherein when the second transmission line is not accessed, the first switch is brought into a non-conductive state and the fixed potential is supplied to the second transmission line via the second switch.

Further, another aspect of the invention is a semiconductor device comprising: a first sense amplifier; a first transmission line connected to the first sense amplifier; a second transmission line electrically connected to the first sense amplifier via the first transmission line; a third transmission line arranged corresponding to the second transmission line; a first switch controlling a connection between the first and second transmission lines; a second switch controlling a connection between a predetermined fixed potential and the third transmission line; and a third switch controlling a connection between the second and third transmission lines, wherein when the second transmission line is not accessed, the first switch is brought into a non-conductive state, the second switch is brought into a conductive state, and the third switch is brought into a non-conductive state respectively so that the fixed potential is supplied to the third transmission line.

According to the semiconductor device of the invention, the first switch between the first and second transmission lines is brought into a non-conductive state when the first transmission line to be accessed is connected to the first sense amplifier, and the predetermined fixed voltage is supplied to the second transmission line that is not accessed via the second switch. Thus, since the second transmission line is stably maintained at the fixed voltage, it is possible to suppress influence due to the coupling noise from adjacent first transmission lines on both sides. Further, the second transmission line functions as a shield when the first transmission lines on the both sides are accessed. Furthermore, according to the semiconductor device of the invention, it is possible to obtain the same effect as described above by employing a configuration in which the predetermined fixed voltage is supplied to the third transmission line arranged corresponding to the second transmission line that is not accessed.

As described above, according to the present invention, it is possible to appropriately deal with following problems that can occur when the coupling capacitance between the adjacent transmission lines increases due to the miniaturization of manufacturing scale of the semiconductor device, for example. That is, a transmission line that is not accessed is disconnected from the sense amplifier so that the predetermined fixed voltage is supplied to the transmission line, and therefore it is possible to prevent influence of the coupling noise from the adjacent transmission lines, and, for example, when a plurality of bit lines are densely arranged, it is possible to obtain an effect of preventing leakage of electric charge of the memory cell at a bit line that is not to be accessed.

Further, according to one of aspects of the invention, even when the length of the transmission line is lengthened by turning on the switch, the adjacent transmission lines serve as a shield in a region of half the length, thereby decreasing the coupling noise. In this case, as to a transmission line whose length is shortened by turning off the switch, since its capacitance decreases to improve operating margin, it is possible to suppress the influence of the coupling noise from the adjacent transmission lines on the both sides.

Further, according to one of aspects of the invention, by applying the present invention to the semiconductor device comprising a memory cell array with an open bit line structure or a single-ended structure, the coupling noise between adjacent bit lines can be decreased, as described above, and an effect of reducing the charge/discharge current of the bit line by 25 percent can be obtained, in addition to effects of preventing the leakage of electric charge of the memory cell and the improvement in the operating margin in a sensing/amplifying operation of the memory cell array.

Further, according to one of aspects of the invention, the present invention can be effectively applied to a memory cell array with a hierarchical bit line structure. That is, in a case where a global bit line of an upper hierarchy is disconnected from the sense amplifier, the above-mentioned effects can be obtained even when the fixed voltage is not supplied, thereby suppressing the number of switches. Meanwhile, if a switch that supplies the fixed voltage to the global bit line is provided, the coupling noise can be further reduced.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

A typical example of a technical idea solving the problems of the present invention will be shown below. However, it goes without saying that the present invention is not limited to the example of the technical idea and should be construed based on the disclosure of the claims.

Figure 1A:
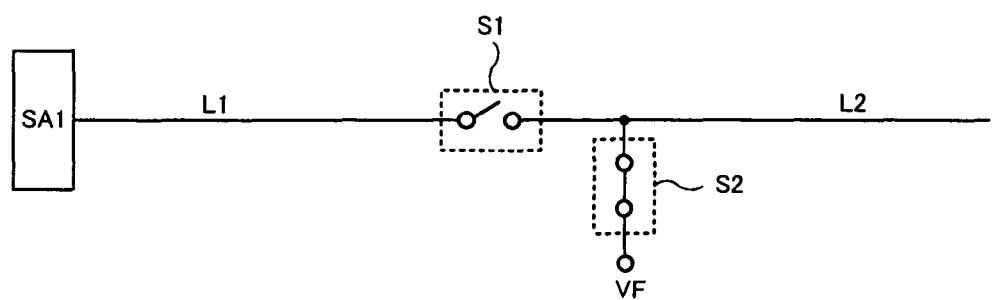
FIGS. 1A and 1B are diagrams showing a technical idea of the invention.

An example of the technical idea of the invention is shown in FIG. 1A, in which a first sense amplifier SA1, first and second transmission lines L1 and L2, and first and second switches S1 and S2 are provided, the first switch S1 controls a connection between the first and second transmission lines L1 and L2, and the second switch S2 controls a connection between a predetermined fixed voltage VF and the second transmission line L2. Then, when the second transmission line L2 is not accessed, the first switch S1 is brought into a non-conductive state, the second switch S2 is brought into a conductive state, and the fixed voltage VF is supplied to the second transmission line L2. Thereby, it is possible to suppress influence of coupling noise from other transmission lines adjacent to the second transmission line L2. Further, the second transmission line L2 can function as a shield for the other transmission lines adjacent thereto.

Figure 1B:
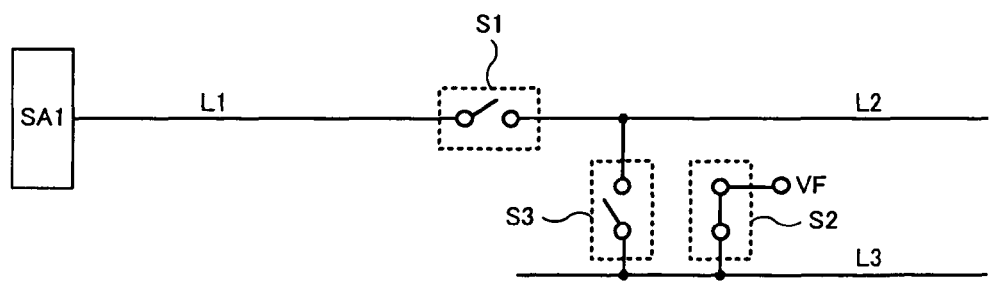

Further, another example of the technical idea of the invention is shown in FIG. 1B, in which the first sense amplifier SA1, the first and second transmission lines L1 and L2, a third transmission line L3 arranged corresponding to the second transmission line L2, and first to third switches S1, S2 and S3 are provided, the first switch S1 controls a connection between the first and second transmission lines L1 and L2, the second switch S2 controls a connection between the predetermined fixed voltage VF and the third transmission line L3, and the third switch S3 controls a connection between the second and third transmission lines L2 and L3. Then, when the second transmission line L2 is not accessed, the first switch S1 is brought into the non-conductive state, the second switch S2 is brought into the conductive state, and the third switch S3 is brought into the non-conductive state. Thereby, it is possible to suppress the influence of coupling noise between the third transmission line L3 and other transmission lines.

Preferred embodiments of the invention will be described in detail below with reference to accompanying drawings. In the following embodiments, the present invention is applied to a DRAM (Dynamic Random Access Memory) as an example of the semiconductor device.

[First Embodiment]

Figure 2:
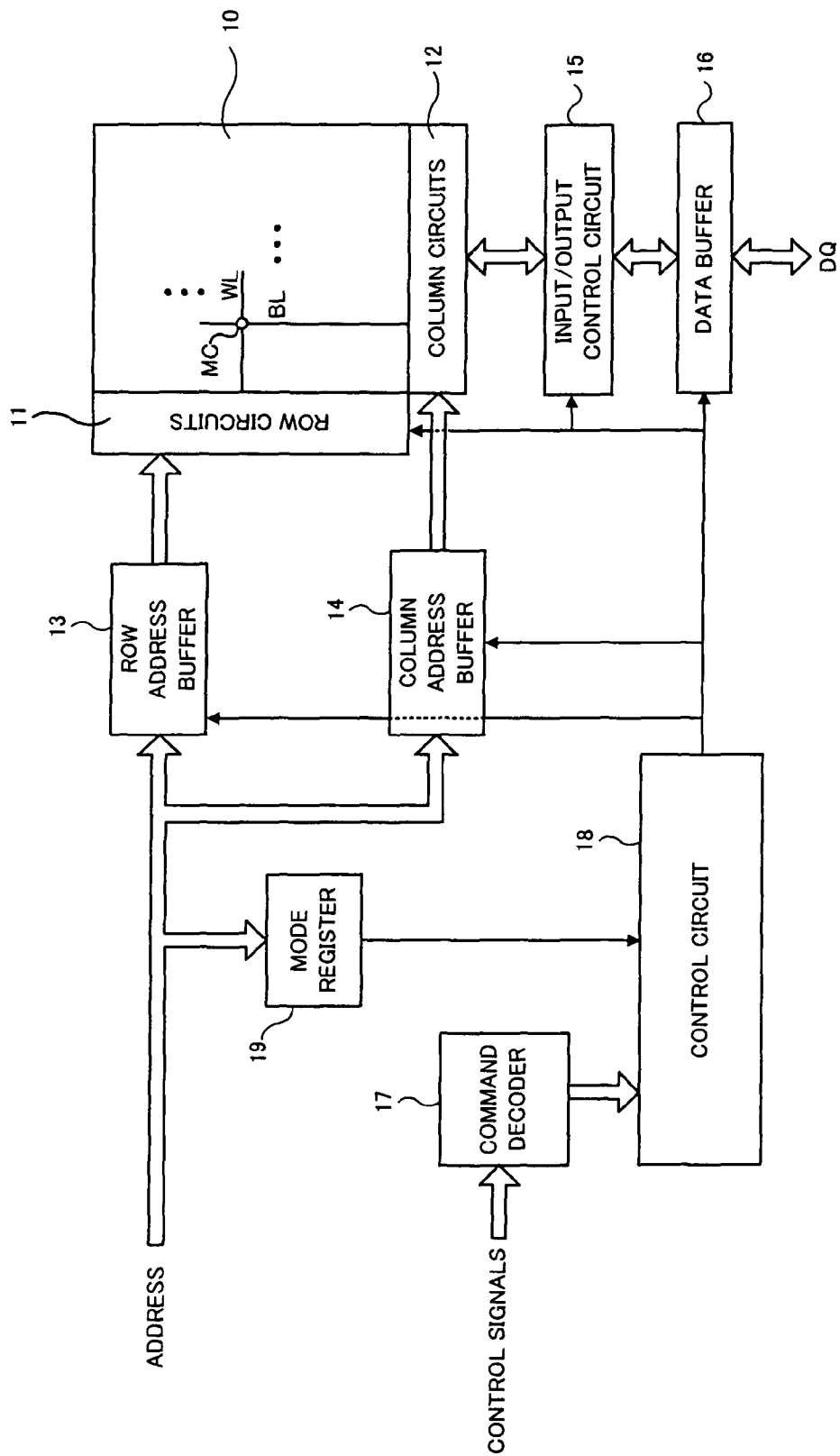
FIG. 2 is a block diagram showing an entire configuration of a DRAM of a first embodiment.

FIG. 2 is a block diagram showing an entire configuration of the DRAM of a first embodiment. The DRAM shown in FIG. 2 includes a memory cell array 10 including a plurality of memory cells MC arranged at intersections of a plurality of word lines WL and a plurality of bit lines BL, and row circuits 11 and column circuits 12 that are attached to the memory cell array 10. The row circuits 11 includes a large number of circuits provided corresponding to the plurality of word lines WL, and the column circuits 12 includes a large number of circuits provided corresponding to the plurality of bit lines BL.

Externally input addresses includes a row address and a column address, the row address is stored in a row address buffer 13 and sent to the row circuits 11, and the column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ).

A command decoder 17 determines a command for the DRAM based on externally input control signals and sends the command to a control circuit 18. The control circuit 18 controls operations of respective parts of the DRAM according to a command type determined by the command decoder 17. The operation control of the control circuit 18 is performed in conjunction with an internal clock generated by a clock generation circuit (not shown). Further, a mode register 19 selectively sets operation modes of the DRAM and sends setting information to the control circuit 18.

Figure 3:
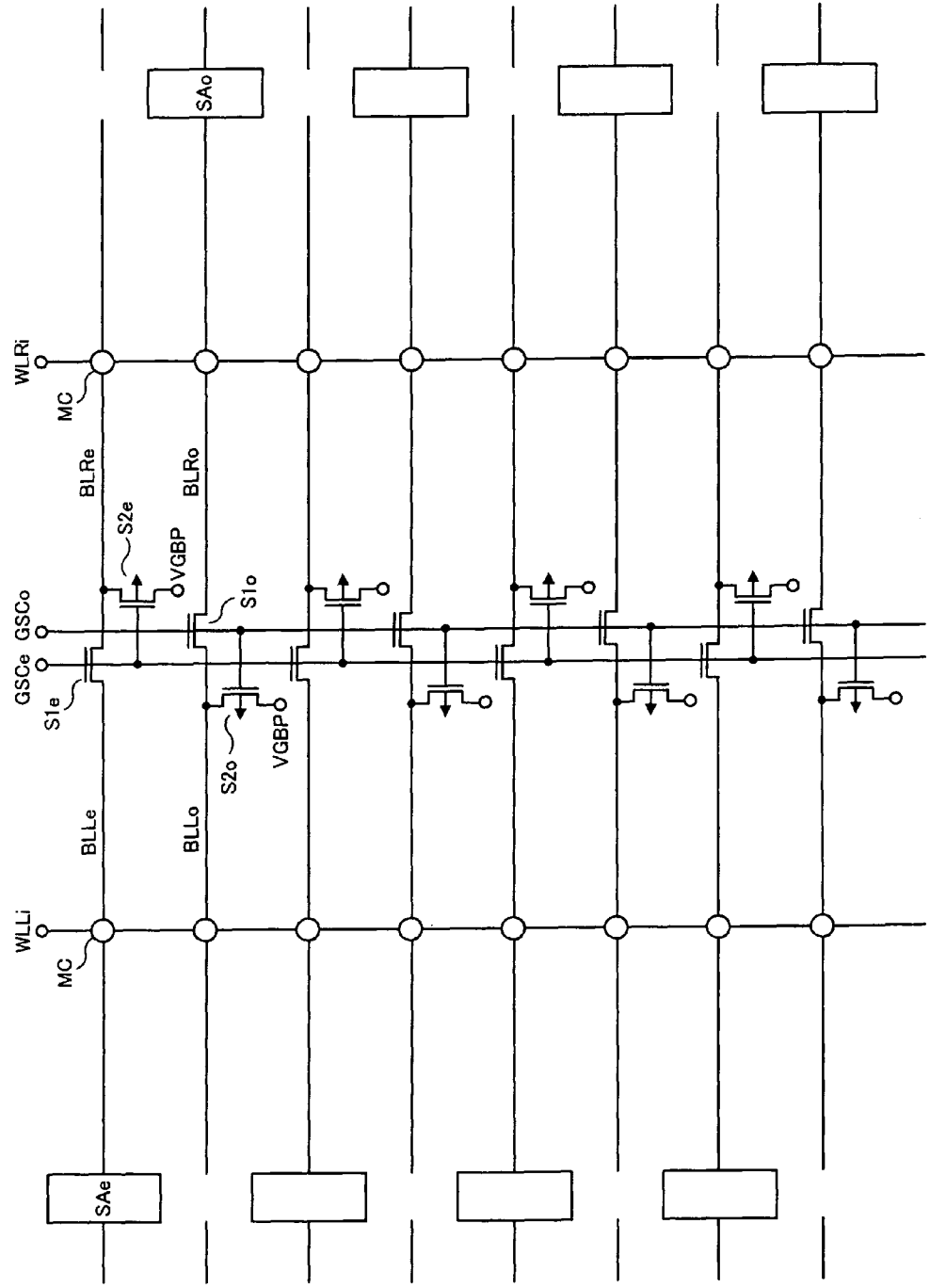
FIG. 3 is a diagram showing a configuration of a memory cell array and its peripheral portion in the DRAM of the first embodiment.

Next, FIG. 3 shows a configuration of the memory cell array 10 and its peripheral portion in the DRAM of FIG. 2. The first embodiment employs the memory cell array 10 of an open bit line structure, as shown in FIG. 3. In the memory cell array 10 of FIG. 3, there are arranged, for example, 2M word lines WL and N bit lines BL, and the memory cells MC are formed at all intersections of the word lines WL and the bit lines BL. N/2 sense amplifiers SAe are arranged on the left of the memory cell array 10, and N/2 sense amplifiers SAo are arranged on the right of the memory cell array 10. Although one word line WLLi on the left and one word line WLRi on the right are shown in the example of FIG. 3, actually M (2M in total) word lines WL are arranged in each of left and right areas that are separated at a position of switches S1e and S1o. The same expression will be used in the following configurations of the memory cell array 10.

In FIG. 3, assuming that the N bit lines BL are arranged in order from No. 0 to No. N−1 from the top of FIG. 3, each of even numbered bit lines BL is divided into a bit line BLLe on the left (the first transmission line of the invention) and a bit line BLRe on the right (the second transmission line of the invention) by the switch S1e (the first switch of the invention) composed of an NMOS transistor inserted at an approximate center position. The bit line BLLe on the left is connected to a sense amplifier SAe on the left (the first sense amplifier of the invention), and the bit line BLRe on the right is connected to a switch S2e (the second switch of the invention) functioning as a potential fixing circuit that is composed of a PMOS transistor. Similarly, each of odd numbered bit lines BL is divided into a bit line BLLo on the left and a bit line BLRo on the right by the switch S1o composed of an NMOS transistor inserted at the approximate center position. The bit line BLRo on the right is connected to a sense amplifier SAo on the right, and the bit line BLLo on the left is connected to a switch S2o functioning as a potential fixing circuit that is composed of a PMOS transistor. In the memory cell array 10 of FIG. 3, the same configuration is repeated for each adjacent two bit lines BL, and configuration and operation corresponding to the two bit lines BL at the top will be mainly described below.

In each of the even numbered bit lines BL, a control signal GSCe is applied to the gate of the NMOS transistor of the switch S1e and the gate of the PMOS transistor of the switch S2e, respectively. Accordingly, when the control signal GSCe is at a high level, the bit lines BLLe and BLRe on both sides are connected to each other, and when the control signal GSCe is at a low level, the bit lines BLLe and BLRe on both sides are disconnected from each other and a fixed voltage VGBP is supplied to the bit line BLRe on the right. Meanwhile, in each of the odd numbered bit lines BL, a control signal GSCo is applied to the gate of the NMOS transistor of the switch S1o and the gate of the PMOS transistor of the switch S2o, respectively. Accordingly, when the control signal GSCo is at a high level, the bit lines BLLo and BLRo on both sides are connected to each other, and when the control signal GSCo is at a low level, the bit lines BLLo and BLRo on both sides are disconnected from each other and the fixed voltage VGBP is supplied to the bit line BLLo on the left.

Figure 4:
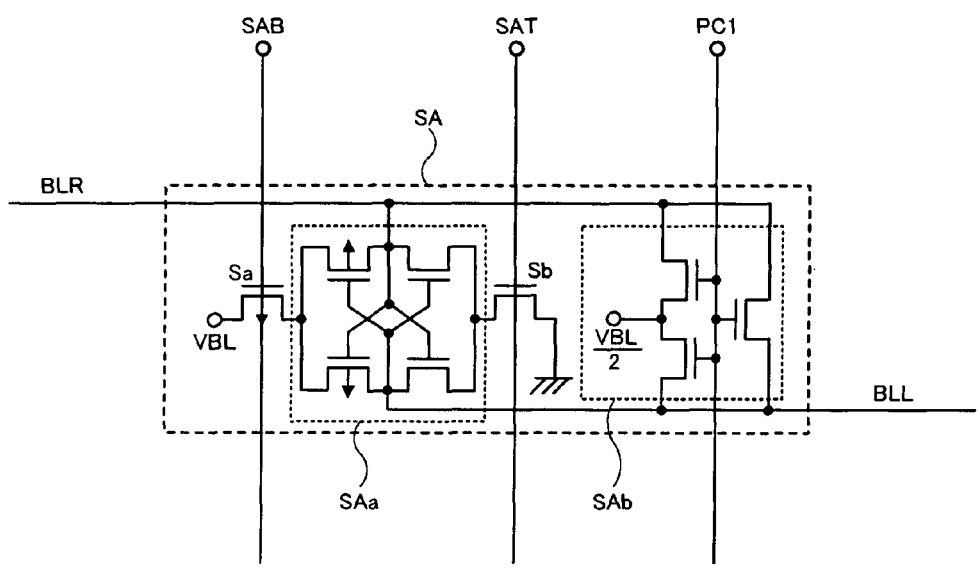
FIG. 4 is a circuit configuration example of a sense amplifier of FIG. 3.

FIG. 4 shows a circuit configuration example of the sense amplifier SA (SAe, SAo) of FIG. 3. The sense amplifiers SA shown in FIG. 4 includes a latch circuit SAa, an equalizing circuit SAb, a switch Sa composed of a PMOS transistor, and a switch Sb composed of an NMOS transistor. The latch circuit SAa includes an inverter receiving an input from the bit line BLR of one memory cell array 10 and an inverter receiving an input from the bit line BLL of the other memory cell array 10, which are cross-coupled to each other at their inputs and outputs. A power supply voltage VBL and a ground potential are supplied to the latch circuit SAa via switches Sa and Sb controlled in response to control signals SAB and SAT. The equalizing circuit SAb includes two (a pair of) NMOS transistors that precharge the bit line pair BLR and BLL to a voltage VBL/2 in response to a control signal PC1, and one NMOS transistor that equalizes the bit line pair BLR and BLL in response to the control signal PC1.

Figure 5:
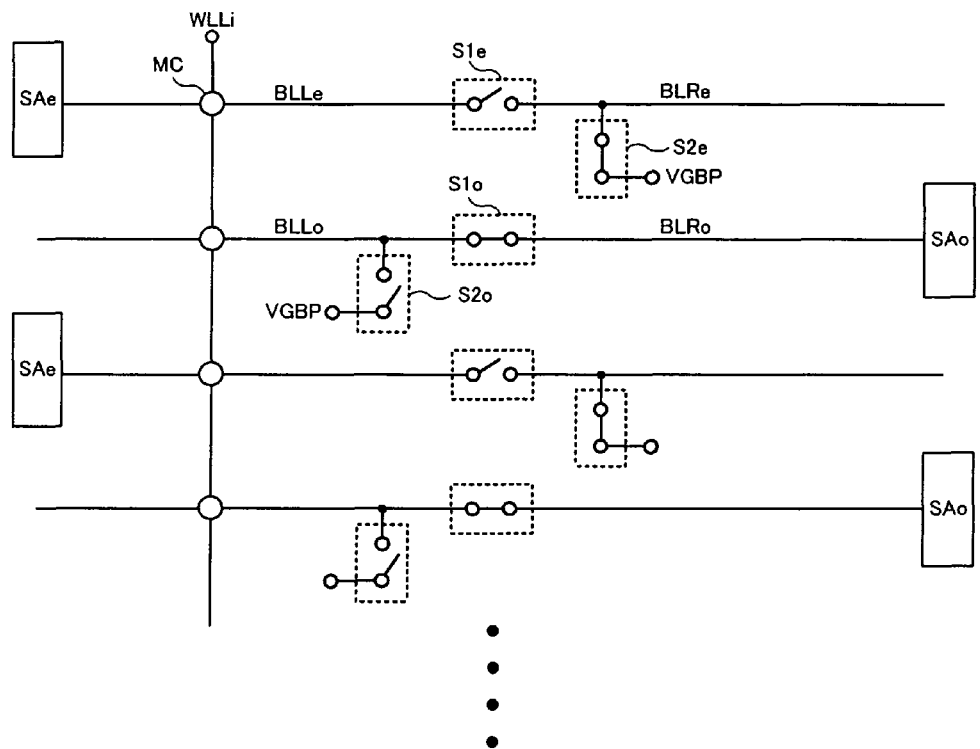
FIG. 5 is a diagram showing an operation of the memory cell array of FIG. 3.

Here, an operation of the memory cell array 10 of FIG. 3 will be described with reference to FIG. 5. FIG. 5 schematically shows a connection state in which the word line WLLi on the left is selected in a partial area (an upper half of FIG. 3) of the memory cell array 10. In this state, the control signal GSCe is controlled to a low level, and the control signal GSCo is controlled to a high level. Accordingly, the switch S1e is turned off and the switch Ste is turned on at each even numbered bit line BL, so that the fixed voltage VGBP is supplied to the bit line BLRe on the right in a state of being disconnected from the sense amplifier SAe on the left. Meanwhile, the switch S1o is turned on and the switch S2o is turned off at each odd numbered bit line BL, so that the bit line BLLo on the left is connected to the sense amplifier SAo on the right. At this point, since states of the switches S1e and S1o are different from each other, the length of the disconnected bit line BLRe is half that of the connected bit lines BLLo and BLRo.

As a result, in a read operation, since the bit line BLRe that is not to be accessed can be maintained at the fixed voltage VGBP, it is possible to prevent voltage fluctuation due to the coupling noise caused by the bit lines BLRo that are adjacent on both sides. Particularly, the influence of the coupling noise can be suppressed when inverted low-level data is written to the bit line BLLo adjacent to the disconnected bit line BLRe after reading out the high-level data. Therefore, it is possible to reliably prevent leakage of electric charge of the memory cell MC connected to the bit line BLRe. Further, among the odd numbered bit lines BL of FIG. 5, adjacent bit lines BLRo on both sides of the bit line BLRe are shielded from each other by the bit line BLRe therebetween, and thus the mutual coupling noise between the bit lines BLRo can be reduced.

[Second Embodiment]

Figure 6:
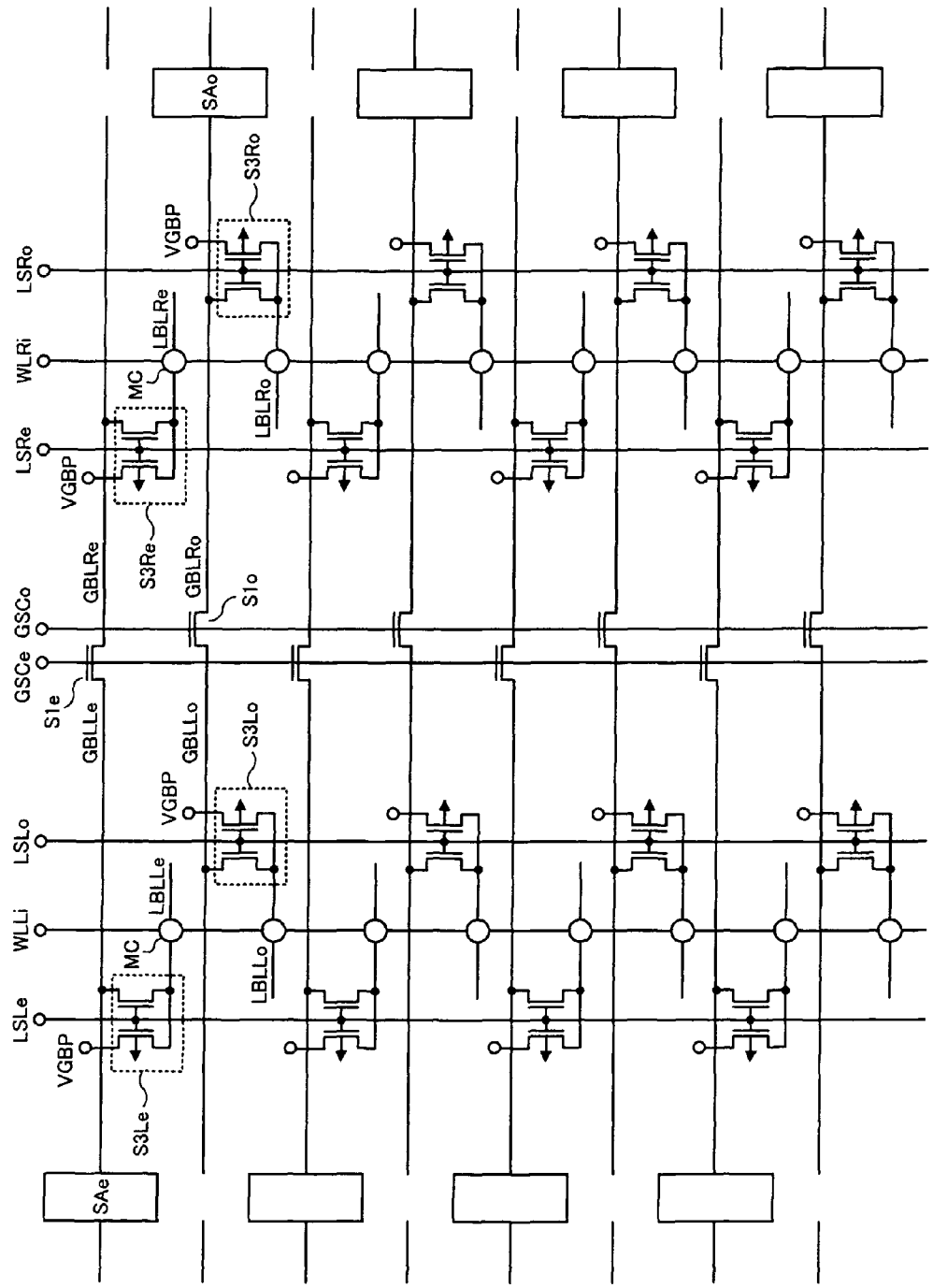
FIG. 6 is a diagram showing a configuration of the memory cell array and its peripheral portion in the DRAM of a second embodiment.

Next, the DRAM of a second embodiment will be described. The entire configuration of the DRAM of the second embodiment is the same as in FIG. 2. FIG. 6 shows a configuration of the memory cell array 10 and its peripheral portion in the DRAM of the second embodiment. The memory cell array 10 of the second embodiment employs a hierarchical bit line structure in addition to the open bit line structure. In FIG. 6, the word lines WL and the sense amplifiers SAe and Sao are arranged in the same manner as in the first embodiment. Meanwhile, the bit lines BL are hierarchized into global bit lines GBL and local bit lines LBL each partitioned into L segments in an extending direction of each global bit line GBL, and a plurality of memory cells MC are formed at intersections of a plurality of word lines WL and a plurality of local bit lines LBL. By employing such a hierarchical bit line structure, the length of each local bit line LBL can be shortened so as to reduce a parasitic capacitance. The structure of each local bit line LBL is not particularly restricted. However, if, for example, wiring structure embedded in a silicon substrate is employed, it is possible to achieve a shielding structure for the adjacent local bit lines LBL and a reduction in parasitic capacitance.

In FIG. 6, global bit lines GBL are divided by the switches S1e and S1o similarly as in FIG. 3. That is, each of even numbered global bit lines GBL is divided into a global bit line GBLLe (the first transmission line of the invention) on the left and a global bit line GBLRe (the second transmission line of the invention) on the right by the switch S1e (the first switch of the invention) controlled in response to the control signal GSCe, and each of odd numbered global bit lines GBL is divided into a global bit line GBLLo on the left and a global bit line GBLRo on the right by the switch S1o controlled in response to the control signal GSCo. In a left area of the memory cell array 10, local bit lines LBLLe (the fourth transmission lines of the invention) are arranged corresponding to the even numbered global bit lines GBLLe, and local bit lines LBLLo are arranged corresponding to the odd numbered global bit lines GBLLo. In a right area of the memory cell array 10, local bit lines LBLRe (the third transmission lines of the invention) are arranged corresponding to the even numbered global bit lines GBLRe, and local bit lines LBLRo are arranged corresponding to the odd numbered global bit lines GBLRo.

In the left area, there are provided a switch S3Le connected to the left end of each even numbered local bit line LBLLe and a switch S3Lo connected to the right end of each odd numbered local bit line LBLLo. The switch S3Le is composed of a pair of NMOS and PMOS transistors having respective gates to which a control signal LSLe is applied, and selectively connects either the global bit line GBLLe or the fixed voltage VGBP to the local bit line LBLLe. The switch S3Lo is composed of a pair of NMOS and PMOS transistors having respective gates to which a control signal LSLo is applied, and selectively connects either the global bit line GBLLo or the fixed voltage VGBP to the local bit line LBLLo.

In the right area, there are provided a switch S3Re (the second/third switch of the invention) connected to the left end of each even numbered local bit line LBLRe and a switch S3Ro connected to the right end of each odd numbered local bit line LBLRo. These switches S3Re and S3Ro are configured in the same manner as the above switches S3Le and S3Lo. Then, the switch S3Re selectively connects either the global bit line GBLRe or the fixed voltage VGBP to the local bit line LBLRe. The switch S3Ro selectively connects either the global bit line GBLRo or the fixed voltage VGBP to the local bit line LBLRo.

Figure 7:
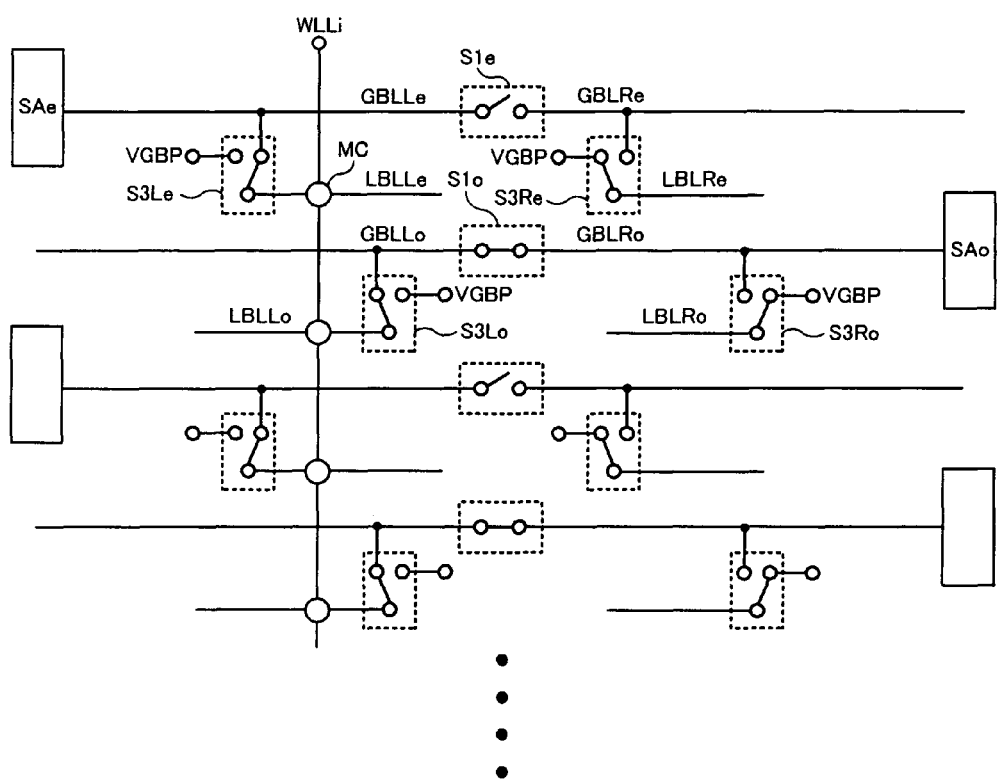
FIG. 7 is a diagram showing an operation of the memory cell array of FIG. 6.

Here, an operation of the memory cell array 10 of FIG. 6 will be described with reference to FIG. 7. FIG. 7 schematically shows a connection state in which the word line WLLi on the left is selected in a partial area (an upper half of FIG. 6) of the memory cell array 10. In this state, since the control signal GSCe is controlled to a low level and the control signal GSCo is controlled to a high level, the switch S1e is turned off and the switch S1o is turned on. Thus, the global bit line GBLRe on the right is disconnected from the sense amplifier SAe on the left, and the global bit line GBLLo on the left is connected to the sense amplifier SAo on the right via the switch S1o. Further, since the control signals LSLe and LSLo are both controlled to a high level in the left area, the local bit lines LBLLe and LBLLo are connected to the global bit lines GBLLe and GBLLo via the switches S3Le and S3Lo, respectively. Meanwhile, since the control signals LSRe and LSRo are both controlled to a low level in the right area, the fixed voltage VGBP is supplied to the local bit lines LBLRe and LBLRo via the switches S3Re and S3Ro, respectively.

As a result, in a read operation, since the respective local bit lines LBLRe and LBLRo that are not to be accessed can be maintained at the fixed voltage VGBP, it is possible to prevent noise propagation to the local bit lines LBLRe and LBLRo even when the voltage fluctuation due to the coupling noise caused by adjacent global bit lines GBLRo on both sides of the global bit line GBLRe. Further, since the global bit line GBLRe in a floating state exists between these global bit lines GBLRo, a mutual coupling capacitance between the global bit lines GBLRo can be reduced so as to suppress the coupling noise.

Figure 8:
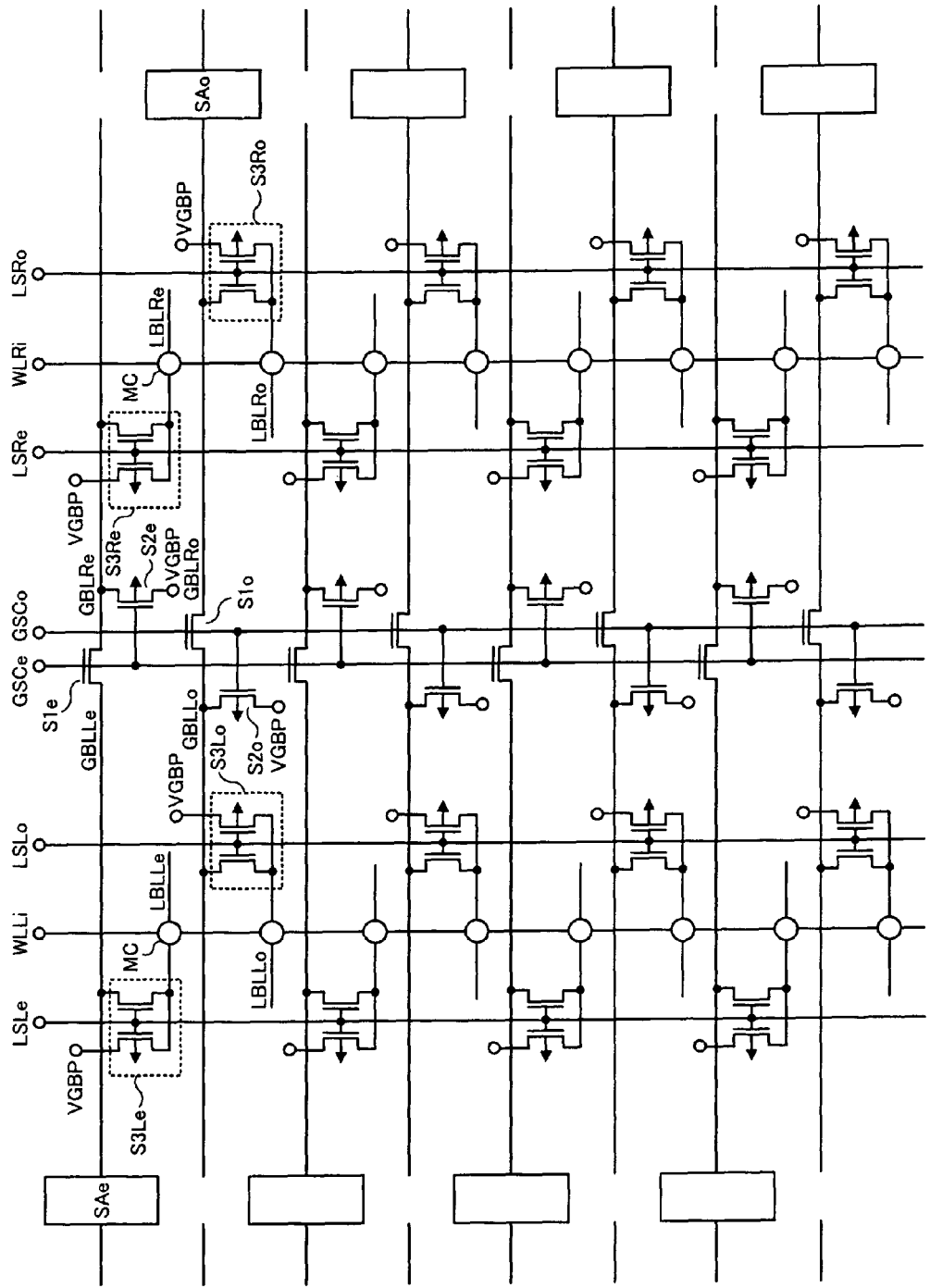
FIG. 8 is a block diagram showing a modification of the second embodiment.

Next, a modification of the second embodiment will be described with reference to FIG. 8. In FIG. 8, switches S2e connected to the even numbered global bit lines GBLRe and switches S2o connected to the odd numbered global bit lines GBLRo are provided in addition to the configuration of the memory cell array 10 of the second embodiment (FIG. 6). The configuration and function of the switches S2e and S2o are the same as the switches S2e and S2o in FIG. 3 of the first embodiment. For example, in the connection state of FIG. 7, the fixed voltage VGBP is supplied to the global bit lines GBLRe by the control signal GSCe at the low level. Accordingly, an effect of shielding between the adjacent global bit lines GBLRo or between the adjacent global bit lines GBLLe can be obtained in addition to the above-mentioned effects, thereby reducing the mutual coupling noise between the global bit lines GBLRo or GBLLe.

[Third Embodiment]

Figure 9:
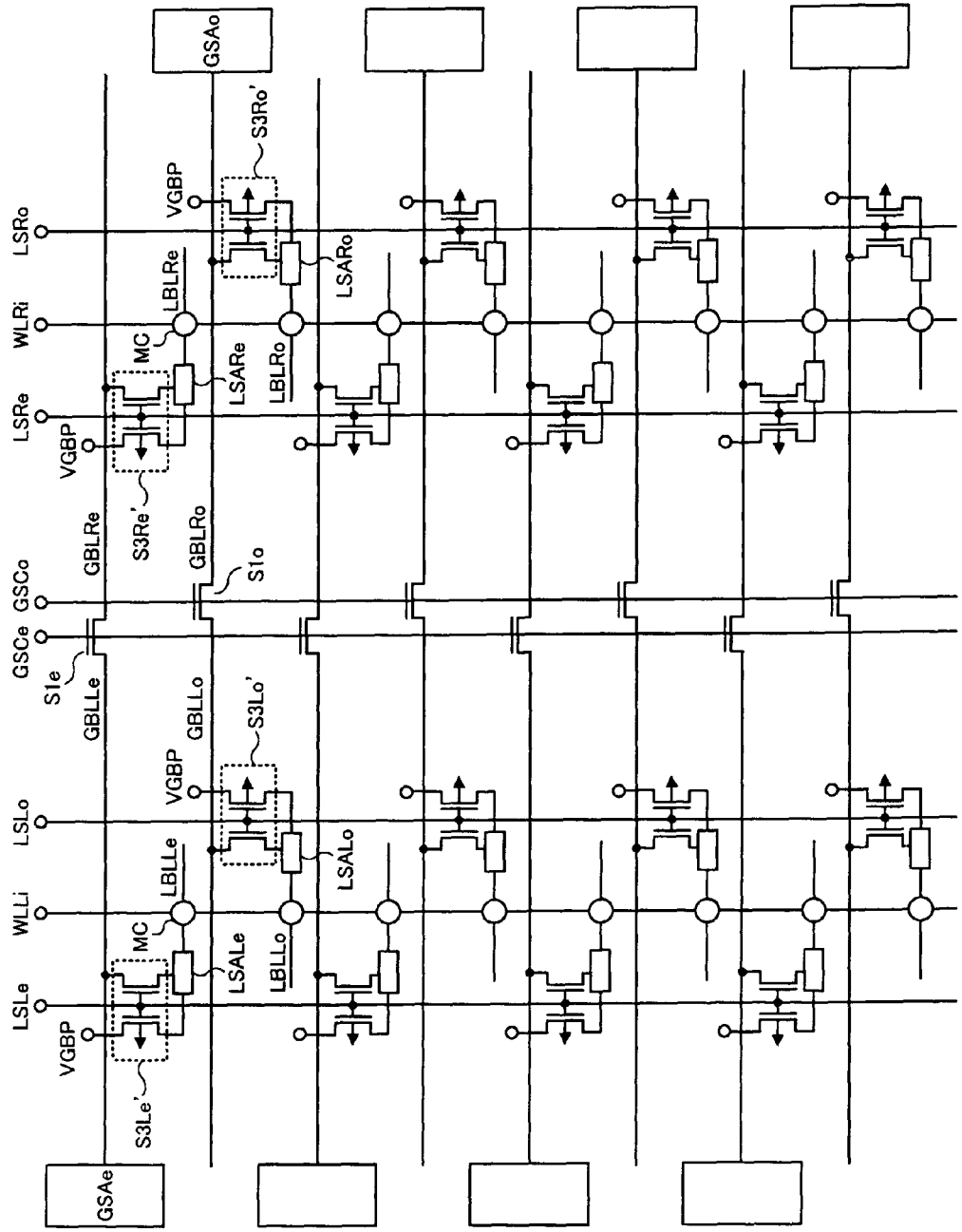
FIG. 9 is a diagram showing a configuration of the memory cell array and its peripheral portion in the DRAM of the third embodiment.

Next, the DRAM of a third embodiment will be described. The entire configuration of the DRAM of the third embodiment is the same as in FIG. 2. FIG. 9 shows a configuration of the memory cell array 10 and its peripheral portion in the DRAM of the third embodiment. In the memory cell array 10 of the third embodiment, a single-ended structure is employed for each of the global bit lines GBL and the local bit lines LBL in the hierarchical bit line structure, and single-ended global sense amplifiers GSA (GSAe and GSAo) are provided. Further, local sense amplifiers LSA (LSALe, LSARe, LSALo and LSARo) of a lower hierarchy are provided at one end of each local bit line LBL. For example, the wiring structure embedded in the silicon substrate can be employed for the structure of each local bit line LBL, similarly as in FIG. 6.

In FIG. 9, the global bit lines GBL are respectively divided by the switches S1e and S1o similarly as in FIG. 6. Further, switches S3Le' and S3Lo' provided corresponding to the local bit lines LBLLe and LBLLo in the left area and switches S3Re' and S3Ro' provided corresponding to the local bit lines LBLRe and LBLRo in the right area includes almost the same configuration and arrangement as the switches S3Le, S3Lo, S3Re and S3Ro in FIG. 6. However, a connection relation of FIG. 9 slightly differs from that of FIG. 6. That is, connections of the respective switches S3Le', S3Re', S3Lo' and S3Ro' are controlled inside the local sense amplifiers LSALe, LSARe, LSALo and LSARo, and they are selectively connected to the local bit lines LBLLe, LBLRe, LBLLo and LBLRo. In addition, the control signals GSCe, GSCo, LSRe, LSRo, LSLe and LSLo of FIG. 9 are controlled in the same manner as in FIGS. 6 and 7.

Figure 10:
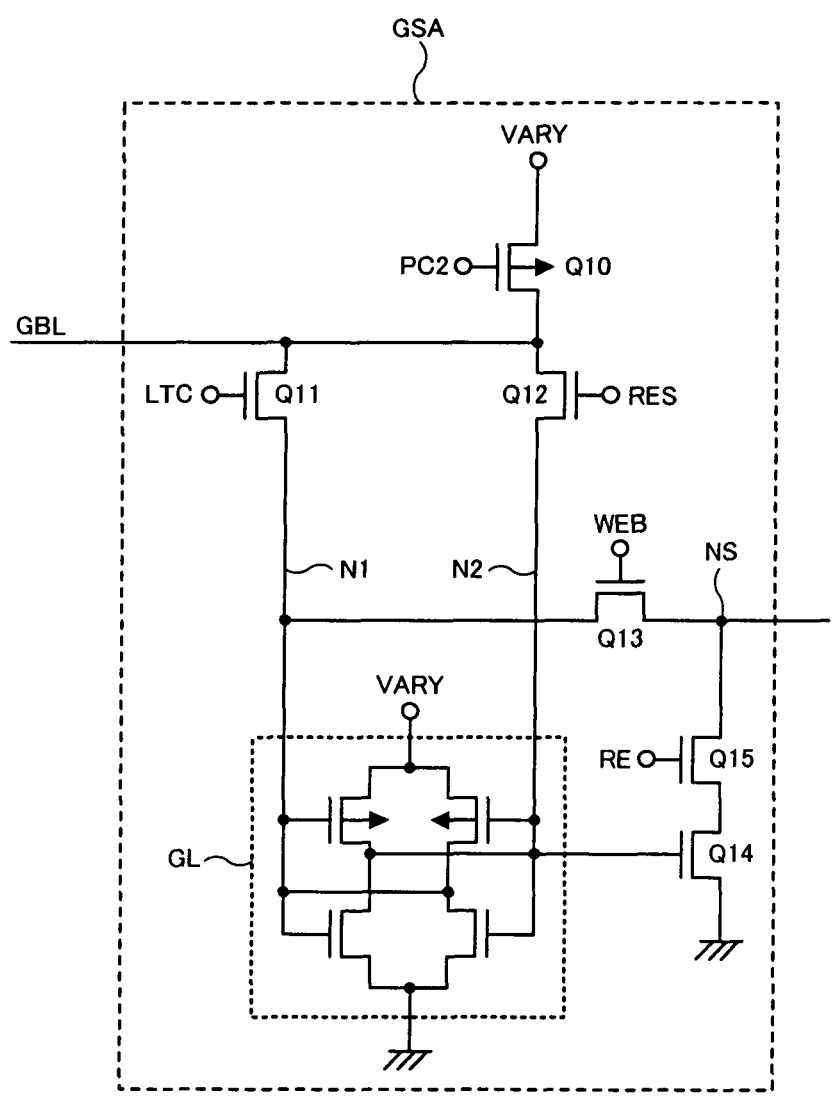
FIG. 10 is a diagram showing a circuit configuration example of a global sense amplifier of FIG. 9.

FIG. 10 shows a circuit configuration example of the global sense amplifier GSA (GSAe, GSAo) of FIG. 9. The global sense amplifier GSA shown in FIG. 10 includes a latch circuit GL, a PMOS type transistor Q10, NMOS type transistors Q11, Q12, Q13, Q14 and Q15. The transistor Q10 precharges the global bit line GBL to a power supply voltage VARY in response to a control signal PCB applied to its gate. The transistor Q11 controls a connection between the global bit line GBL and a node N1 in response to a control signal LTC applied to its gate. The transistor Q12 controls a connection between the global bit line GBL and a node N2 in response to a control signal RES applied to its gate.

The latch circuit GL including two PMOS transistors and two NMOS transistors forms an inverter receiving an input from the node N1 and an inverter receiving an input from the node N2, which determines a signal voltage of the global bit line GBL in a binary value and latches it. The transistor Q13 for a write operation is connected between the node N1 and an input/output node NS, and a control signal WEB is applied to its gate. Two transistors Q14 and Q15 for a read operation are connected in series between the input/output node NS and the ground potential. The node N2 is connected to the gate of the transistor Q14, and a control signal RE is applied to the gate of the transistor Q15.

The global sense amplifier GSA shown in FIG. 10 receives a sensing voltage of the global bit line GBL via the transistor Q11, and after the latch circuit GL latches data, the global sense amplifier GSA outputs a voltage opposite to the sensing voltage to the global bit line GBL via the transistor Q12. Thereby, the amplified original data is restored to the memory cell MC whose data has been lost by destructive reading. Here, a restoration operation is a kind of the write operation.

Figure 11:
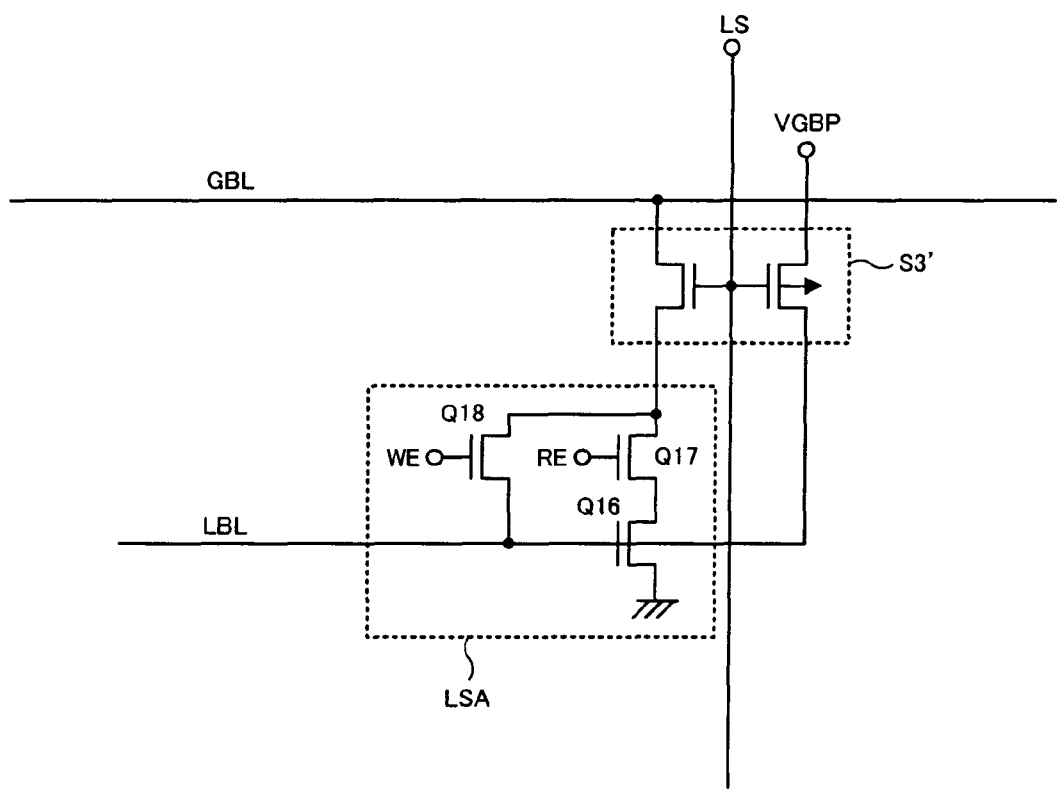
FIG. 11 is a diagram showing a circuit configuration example of a local sense amplifier of FIG. 9.

FIG. 11 shows a circuit configuration example of the local sense amplifier LSA (LSALe, LSARe, LSALo and LSARo) of FIG. 9. The local sense amplifier LSA shown in FIG. 11 includes NMOS type transistors Q16, Q17 and Q18. The transistor Q16 is a sensing transistor that amplifies a read signal transmitted to an gate electrode (input terminal) from the memory cell MC through the local bit line LBL and drives the global bit line GBL from a drain electrode (output terminal). The transistor Q17 connects between the drain of the transistor Q16 and the global bit line GBL via a switch S3' when the control signal RE applied to the gate is at the high level. The transistor Q18 is a write transfer transistor that connects between the local bit line LBL and the global bit line GBL via the switch S3' when the write control signal WE applied to the gate is at the high level. The write data is driven by the global sense amplifier GSA and is written into the memory cell MC through the global bit line GBL, the switch S3', the transistor Q18 and the local bit line LBL.

Figure 12:
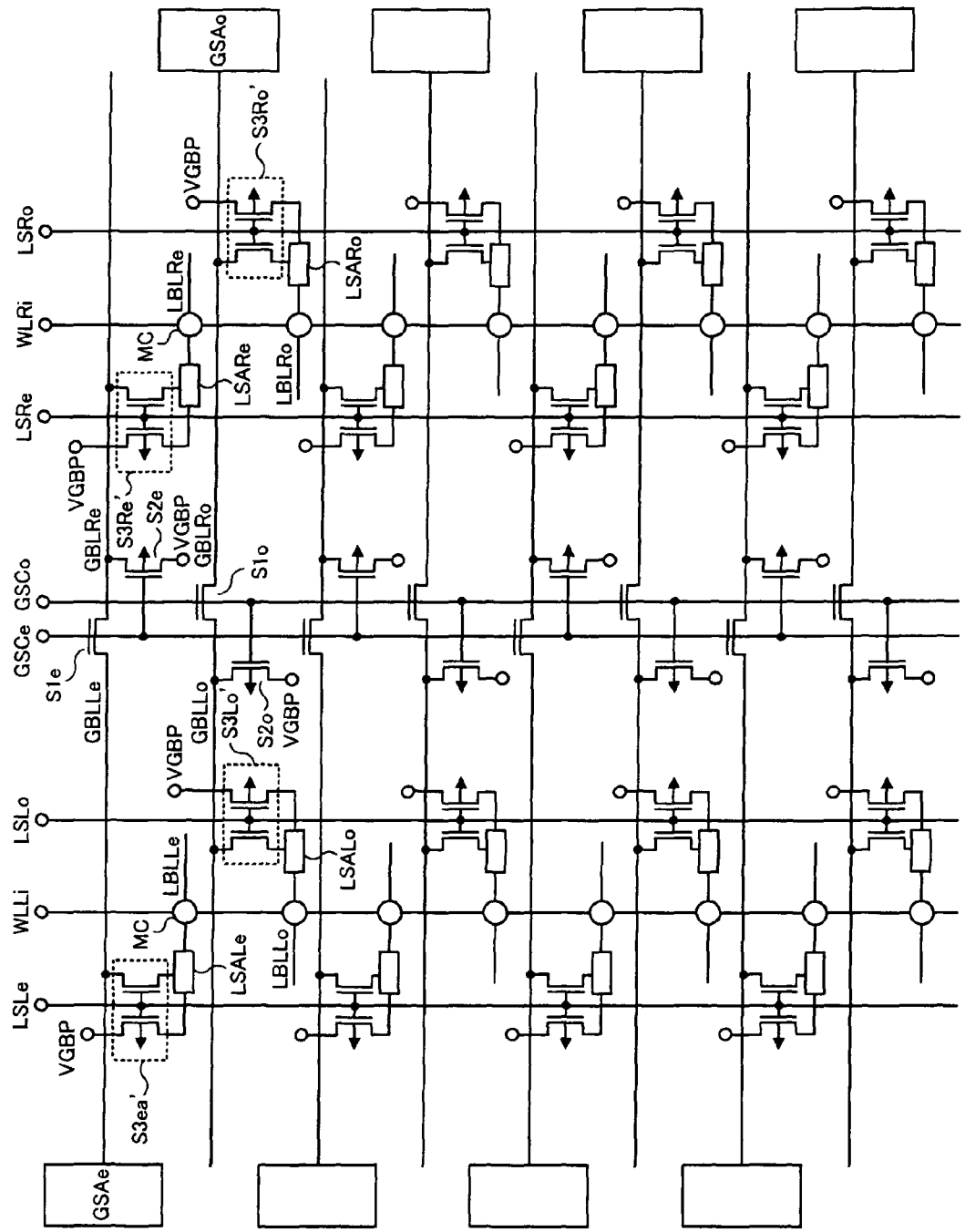
FIG. 12 is a block diagram showing a first modification of a third embodiment.

Next, modifications of the third embodiment will be described with reference to FIGS. 12 to 14. FIG. 12 shows a first modification of the third embodiment, in which switches S2e connected to the even numbered global bit lines GBLRe and switches S2o connected to the odd numbered global bit lines GBLLo are provided in addition to the configuration of the memory cell array 10 of FIG. 9. The configuration and function of the switches S2e and S2o are the same as in FIG. 8. Accordingly, an effect of shielding between the adjacent global bit lines GBLRo or between the adjacent global bit lines GBLLe can be obtained in the read operation in addition to the above-mentioned effects, thereby reducing the mutual coupling noise between the global bit lines GBLRo or GBLLe.

Figure 13:
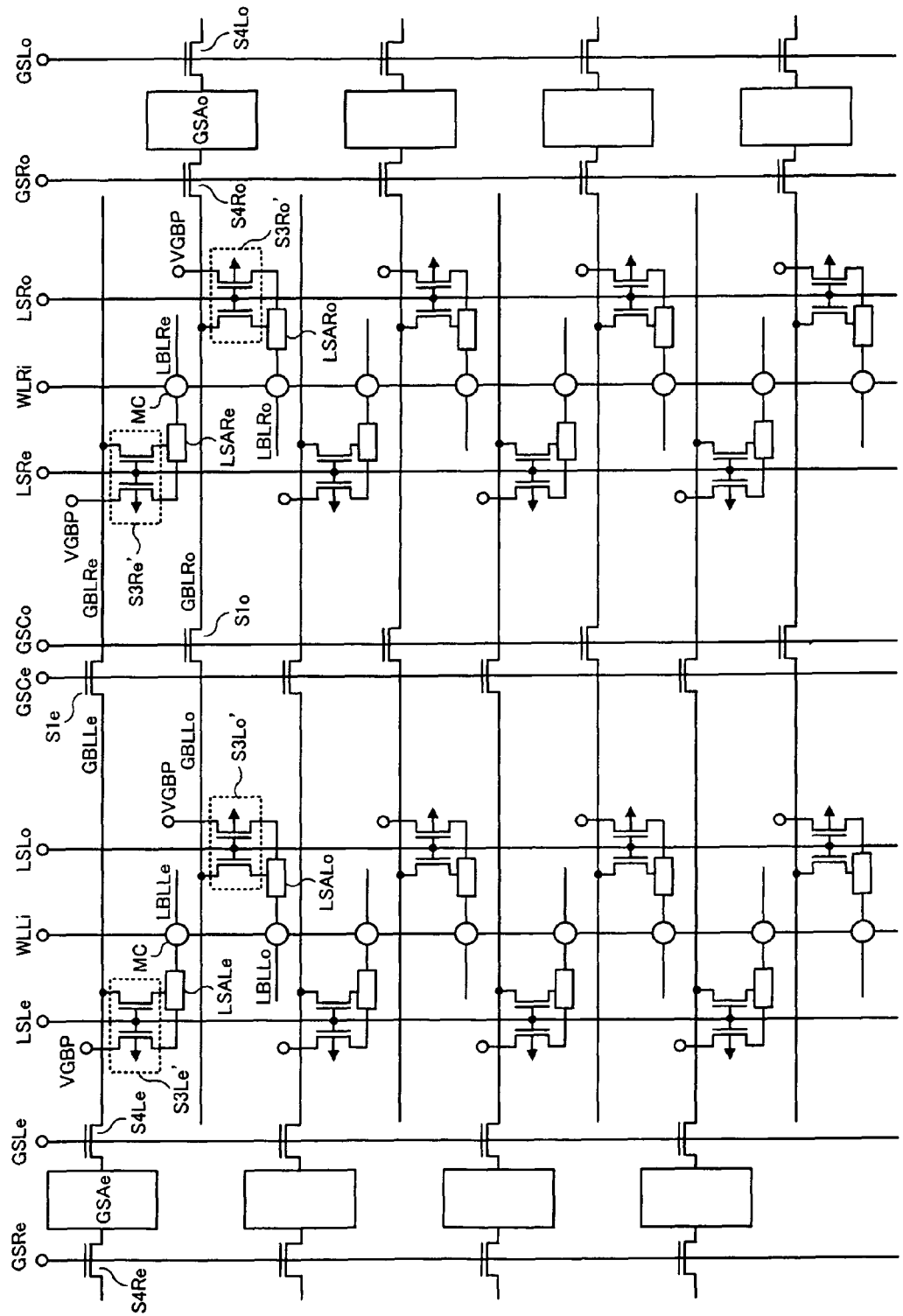
FIG. 13 is a block diagram showing a second modification of the third embodiment.

Further, FIG. 13 shows a second modification of the third embodiment, in which each of the global sense amplifiers GSA (GSAe and GSAo) is shared by two global bit lines GBL of adjacent memory cell arrays 10 on both sides in addition to the configuration of the memory cell array 10 of FIG. 9. A switch S4Le composed of an NMOS transistor is inserted between each even numbered global sense amplifier GSAe and the global bit line GBLLe of one memory cell array 10, and a switch S4Re composed of an NMOS transistor is inserted between the global sense amplifier GSAe and the global bit line GBLRe of the other memory cell array 10. Further, a switch S4Ro composed of an NMOS transistor is inserted between each odd numbered global sense amplifier GSAo and the global bit line GBLRo of one memory cell array 10, and a switch S4Lo composed of an NMOS transistor is inserted between the global sense amplifier GSAo and the global bit line GBLLo of the other memory cell array 10. These switches S4Le, S4Re, S4Ro and S4Lo have gates to which control signals GSLe, GSRe, GSRo and GSLo are applied respectively, and non-selected switches thereof disconnect non-selected global bit lines GBL from the global sense amplifier GSA.

Figure 14:
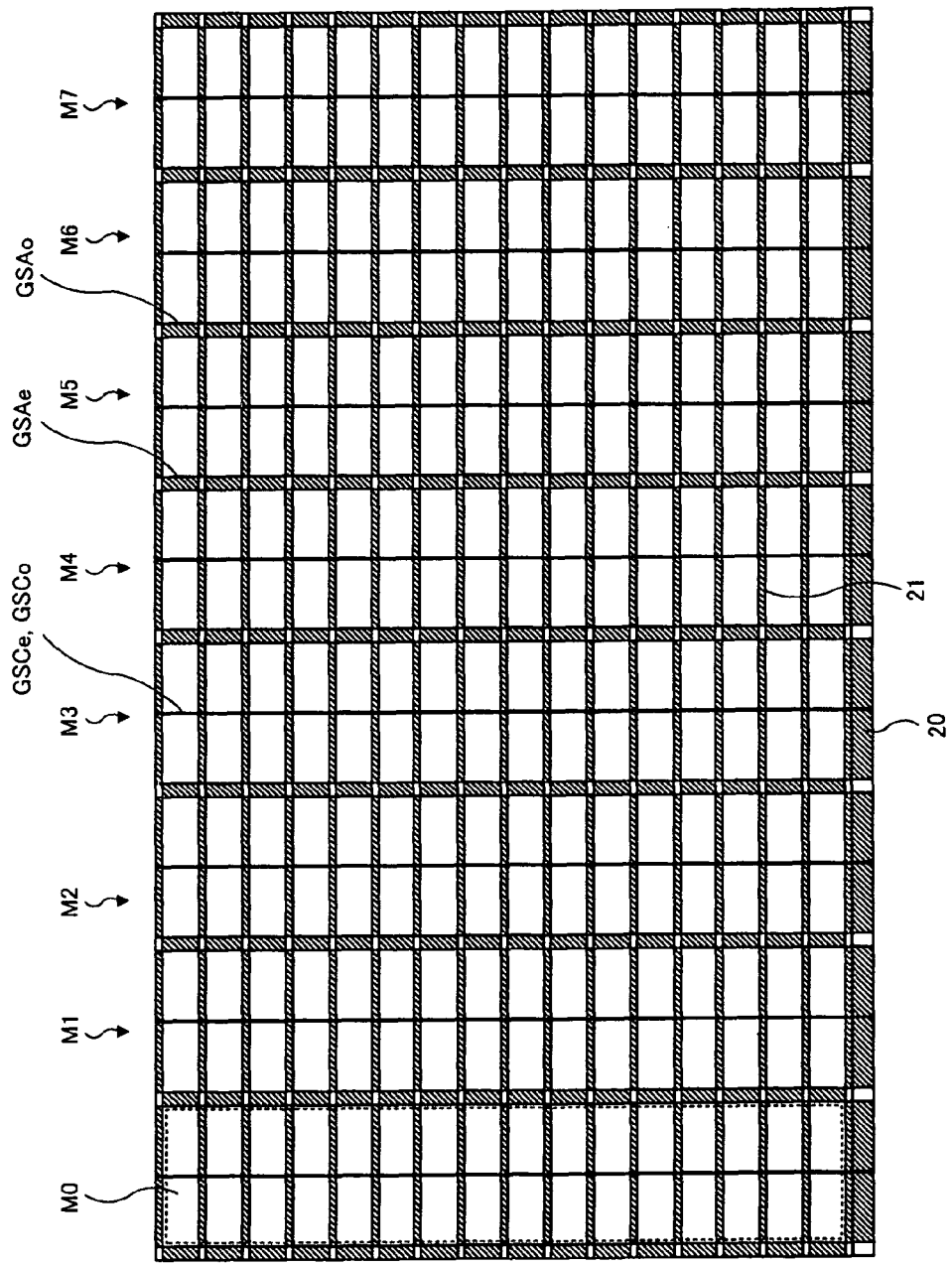
FIG. 14 is a block diagram showing a configuration example of an entire memory cell array of the second modification of the third embodiment.

FIG. 14 is a block diagram showing a configuration example of the entire memory cell array 10 of the second modification of the third embodiment. In the configuration example of FIG. 14, the memory cell array 10 includes eight memory mats M (M0 to M7) aligning in a bit line extending direction. The switches S1e and S1o (FIG. 13) being controlled by the control signals GSCe and GSCo are provided at an approximate center position of each memory mat M, and thereby the memory mat M is divided into left and right. Further, the global sense amplifiers GSAe and GSAo (FIG. 13) are arranged on both sides of each memory mat M, and the global sense amplifiers GSAe and GSAo other than those at both ends of FIG. 14 are shared by the global bit lines GBL included in the adjacent two memory mats M. In the configuration example of FIG. 14, the word lines WL are also hierarchized into main word lines and sub word lines, in which a main word line is selected by a main word decoder 20 and among eight sub word lines, for example, one sub word line corresponding to the selected main word line is selectively driven by a sub-word driver 21.

[Data Processing System]

Figure 15:
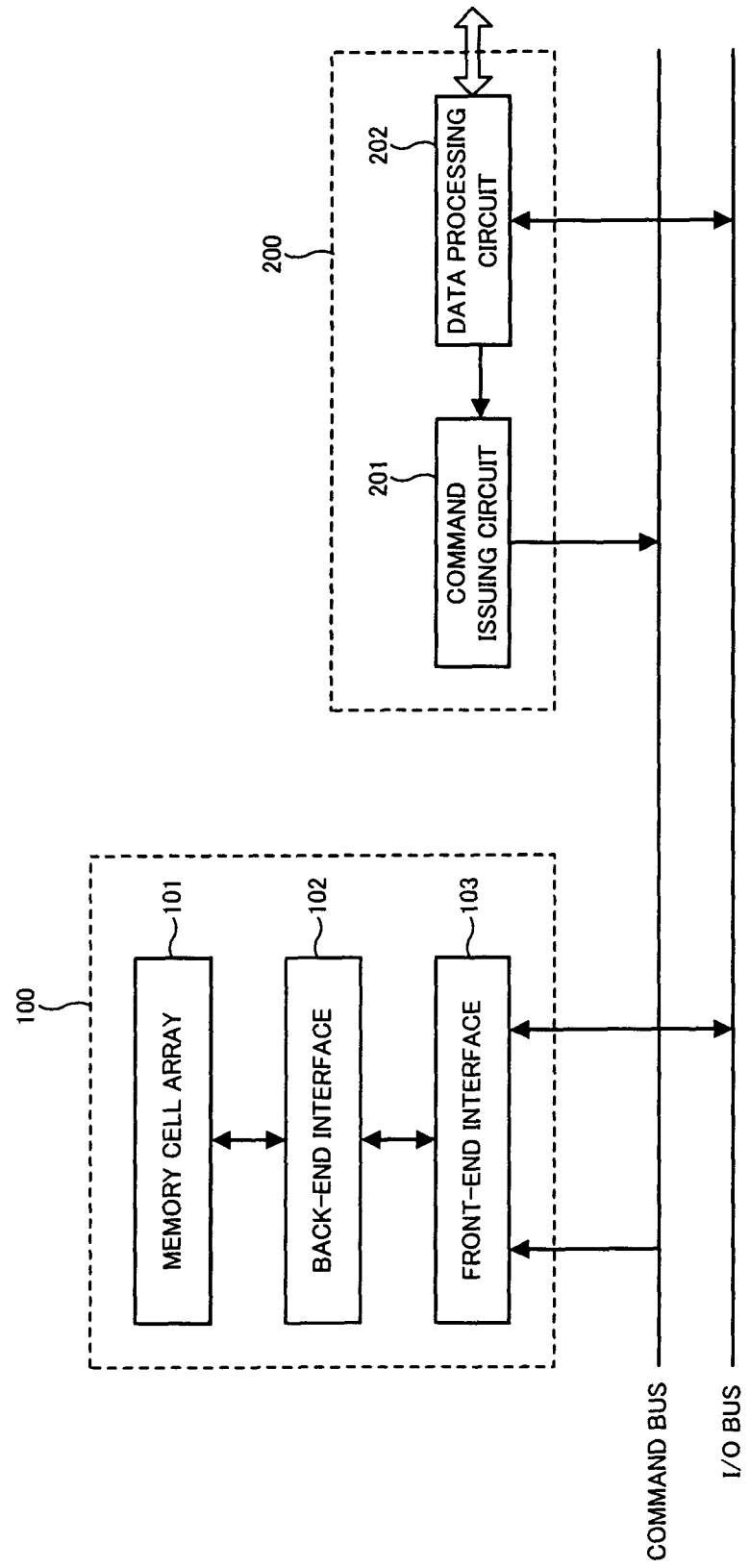
FIG. 15 is a diagram showing a configuration example of a data processing system comprising a semiconductor device including the configuration described in the embodiments and a controller controlling operations of the semiconductor device.
Figure 16:
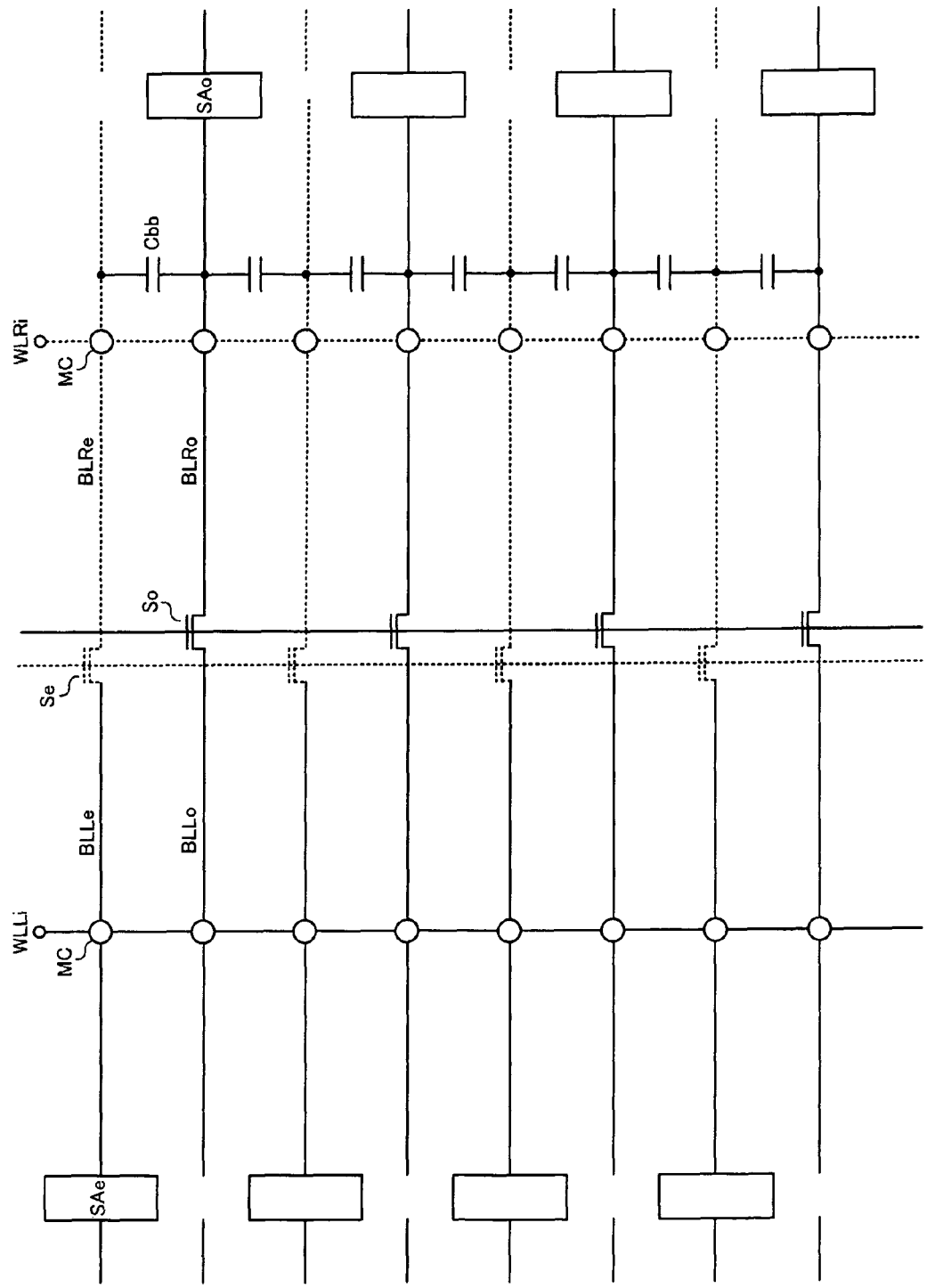
FIG. 16 is a relevant diagram showing a configuration to which a combination of conventional techniques is applied.

Next, a case in which the present invention is applied to a data processing system comprising a semiconductor device will be described. FIG. 15 shows a configuration example of the data processing system comprising a semiconductor device 100 including the configuration described in the embodiments and a controller 200 controlling operations of the semiconductor device 100.

The semiconductor device 100 is provided with a memory cell array 101, a back-end interface 102 and a front-end interface 103. The memory cell array 101 includes the memory cell array 10 of the above embodiments. The back-end interface 102 includes peripheral circuits of the memory cell array 10. The front-end interface 103 comprises a function to communicate with the controller 200 through a command bus and an I/O bus. Although FIG. 15 shows only one semiconductor device 100, a plurality of semiconductor devices 100 may be provided in the system.

The controller 200 is provided with a command issuing circuit 201 and a data processing circuit 202, and controls operations of the system as a whole and the operation of the semiconductor device 100. The controller 200 is electrically connected with the command bus and the I/O bus, and additionally comprises an interface for external connection. The command issuing circuit 201 sends commands to the semiconductor device 100 through the command bus. The data processing circuit 202 sends and receives data to and from the semiconductor device 100 through the I/O bus and performs processes required for the controlling. In addition, the semiconductor device 100 of the embodiments may be included in the controller 200 in FIG. 15.

The data processing system of FIG. 15 is, for example, a system implemented in electronics devices such as personal computers, communication electronics devices, mobile electronics devices and other industrial/consumer electronics devices.

In the foregoing, the preferred embodiments of the present invention have been described. However the present invention is not limited to the above embodiments and can variously be modified without departing the essentials of the present invention. For example, the present invention can be applied to a memory device, a data processor and the like comprising transmission lines of data signals. Further, various circuit configurations can be employed for the sense amplifier SA, the local sense amplifier LSA, the global sense amplifier GSA and the like without being limited to the configurations described in the embodiments.

The present invention is not limited to the DRAM disclosed in the embodiments, and can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the present invention can be applied to various devices such as SOC (System on Chip), MCP (Multi Chip Package) and POP (Package on Package) and the like.

Further, transistors of the present invention are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor.

The present invention can be applied to devices based on various combinations or selections of the disclosure of the embodiments. That is, the present invention covers various modifications which those skilled in the art can carry out in accordance with all disclosures including claims and technical ideas.

The invention claimed is:

1. A semiconductor device comprising:
   a first sense amplifier;
   a first transmission line connected to the first sense amplifier;
   a second transmission line electrically connected to the first sense amplifier via the first transmission line;
   a third transmission line arranged corresponding to the second transmission line;
   a first switch controlling a connection between the first and second transmission lines;
   a second switch controlling a connection between a predetermined fixed potential and the third transmission line; and
   a third switch controlling a connection between the second and third transmission lines,
   wherein when the second transmission line is not accessed, the first switch is brought into a non-conductive state, the second switch is brought into a conductive state, and the third switch is brought into a non-conductive state respectively so that the fixed potential is supplied to the third transmission line.

2. The semiconductor device according to claim 1, wherein the second and third switches are controlled by a common control signal.

3. The semiconductor device according to claim 2 further comprising:
   a fourth transmission line arranged corresponding to the first transmission line;
   a fourth switch controlling a connection between the fixed potential and the fourth transmission line; and
   a fifth switch controlling a connection between the first and fourth transmission lines,
   wherein when the second transmission line is accessed, the first, third and fourth switches are brought into a conductive state, and the second and fifth switches are brought into a conductive state so that the fixed potential is supplied to the fourth transmission line via the fourth switch.

4. The semiconductor device according to claim 3, wherein the fourth and fifth switches are controlled by a common control signal.

5. The semiconductor device according to claim 4 further comprising:
   a second sense amplifier;
   a fifth transmission line connected to the second sense amplifier, the fifth transmission line being adjacent to the second transmission line;
   a sixth transmission line connected to the second sense amplifier via the fifth transmission line, the sixth transmission line being adjacent to the first transmission line;
   a seventh transmission line arranged corresponding to the sixth transmission line, the seventh transmission line being adjacent to the fourth transmission line;
   a sixth switch controlling a connection between the fifth and sixth transmission lines;
   a seventh switch controlling a connection between the fixed potential and the seventh transmission line; and
   an eighth switch controlling a connection between the sixth and seventh transmission lines,
   wherein when the sixth transmission line is not accessed, the sixth switch is brought into a non-conductive state, the seventh switch is brought into a conductive state, and the eighth switch is brought into a non-conductive state respectively so that the fixed potential is supplied to the seventh transmission line.

6. The semiconductor device according to claim 5, wherein the seventh and eighth switches are controlled by a common control signal.

7. The semiconductor device according to claim 6 further comprising:
   an eighth transmission line arranged corresponding to the fifth transmission line, the eighth transmission line being adjacent to the third transmission line;
   a ninth switch controlling a connection between the fixed potential and the eighth transmission line; and
   a tenth switch controlling a connection between the fifth and eighth transmission lines,
   wherein when the sixth transmission line is accessed, the sixth, eighth and ninth switches are brought into a conductive state and the seventh and tenth switches are brought into a non-conductive state so that the fixed potential is supplied to the eighth transmission line via the ninth switch.

8. The semiconductor device according to claim 7, wherein the ninth and tenth switches are controlled by a common control signal.

9. The semiconductor device according to claim 8,
wherein the first, second, fifth and sixth transmission lines are global bit lines,
and the third, fourth, seventh and eighth transmission lines are local bit lines to which memory cells to be accessed are connected, each of the local bit lines being of a lower hierarchy relative to a corresponding one of the global bit lines.

10. The semiconductor device according to claim 9 further comprising:
an eleventh switch controlling a connection between the fixed potential and the second transmission line; and
a twelfth switch controlling a connection between the fixed potential and the sixth transmission line,
wherein when the second transmission line is not accessed, the eleventh switch is brought into a conductive state,
and when the sixth transmission line is not accessed, the twelfth switch is brought into a conductive state.

11. The semiconductor device according to claim 9,
wherein the first and second sense amplifiers are single-ended global sense amplifiers,
and local sense amplifiers are provided between the second and third switches and the third transmission line, between the fourth and fifth switches and the fourth transmission line, between the seventh and eighth switches and the seventh transmission line, and between the ninth and tenth switches and the ninth transmission line, each of the local sense amplifiers being of the lower hierarchy relative to a corresponding one of the global sense amplifiers.

12. The semiconductor device according to claim 11, wherein when the fourth and seventh transmission lines are commonly accessed, the first, third, fourth, seventh and tenth switches are brought into a non-conductive state, and the second, fifth, sixth, eighth and ninth switches are brought into a conductive state.

13. The semiconductor device according to claim 10,
wherein the first and second sense amplifiers are single-ended global sense amplifiers,
and local sense amplifiers are provided between the second and third switches and the third transmission line, between the fourth and fifth switches and the fourth transmission line, between the seventh and eighth switches and the seventh transmission line, and between the ninth and tenth switches and the ninth transmission line, each of the local sense amplifiers being of the lower hierarchy relative to a corresponding one of the global sense amplifiers.

14. The semiconductor device according to claim 10, wherein each of the local sense amplifiers includes a sensing transistor, each of the third, fourth, seventh and eighth transmission lines is connected to a gate electrode of the sensing transistor, and a sensed voltage is outputted to each of the second, first, sixth and fifth transmissions lines from a drain of the sensing transistor.

15. The semiconductor device according to claim 14, wherein each of the local sense amplifiers further includes a write transfer transistor, a write control signal is inputted to a gate electrode of the write transfer transistor, and a drain terminal and a source terminal of the write transfer transistor are connected to corresponding ones of the third, fourth, seventh and eighth transmission lines and the second, first, sixth and fifth transmissions lines.

16. The semiconductor device according to claim 15, wherein each of first and second global sense amplifiers corresponding to the first and second sense amplifiers receives a corresponding sensing voltage of the first and fifth transmission lines, and thereafter outputs a voltage opposite to the sensing voltage to a corresponding one of the first and fifth transmission lines.

17. The semiconductor device according to claim 13, wherein when the fourth and seventh transmission lines are commonly accessed, the first, third, fourth, seventh, tenth and twelfth switches are brought into a non-conductive state, and the second, fifth, sixth, eighth, ninth and eleventh switches are brought into a conductive state.

18. The semiconductor device according to claim 9, wherein the fourth and seventh transmission lines are commonly accessed, and the third and eighth transmission lines are commonly accessed.

19. The semiconductor device according to claim 18,
wherein the first sense amplifier has a first input terminal and a second input terminal,
the first input terminal is connected to the first transmission line,
the second input terminal is connected to a first other transmission line,
and the first sense amplifier selectively senses data of the transmission line via one of the first and second input terminals.

20. The semiconductor device according to claim 19, further comprising:
a thirteenth switch controlling a connection between the first input terminal and the first transmission line; and
a fourteenth switch controlling a connection between the second input terminal and the first other transmission line,
wherein the thirteenth and fourteenth switches are provided on both sides of the first sense amplifier.

21. The semiconductor device according to claim 20,
wherein the second sense amplifier has a third input terminal and a fourth input terminal,
the third input terminal is connected to the fifth transmission line,
the fourth input terminal is connected to a second other transmission line,
and the second sense amplifier selectively senses data of the transmission line via one of the third and fourth input terminals.

22. The semiconductor device according to claim 21, further comprising:
a fifteenth switch controlling a connection between the third input terminal and the fifth transmission line; and
a sixteenth switch controlling a connection between the fourth input terminal and the second other transmission line,
wherein the fifteenth and sixteenth switches are provided on both sides of the second sense amplifier.

23. A data processing system comprising:
a semiconductor device; and
a controller controlling an operation of the semiconductor device,
the semiconductor device comprising:
a first sense amplifier;
a first transmission line connected to the first sense amplifier;
a second transmission line electrically connected to the first sense amplifier via the first transmission line;

a third transmission line arranged corresponding to the second transmission line;

a first switch controlling a connection between the first and second transmission lines;

a second switch controlling a connection between a predetermined fixed potential and the third transmission line; and a third switch controlling a connection between the second and third transmission lines, wherein when the second transmission line is not accessed, the first switch is brought into a non-conductive state, the second switch is brought into a conductive state, and the third switch is brought into a non-conductive state respectively so that the fixed potential is supplied to the third transmission line.

* * * * *